United States Patent
Lai et al.

(10) Patent No.: US 6,383,903 B1
(45) Date of Patent: May 7, 2002

(54) METHOD FOR FORMING THE PARTIAL SALICIDE

(75) Inventors: Erh-Kun Lai, Taichung; Hsin-Huei Chen, Miao-Li; Ying-Tso Chen, Kaohsiung; Shou-Wei Hwang, Chilung; Yu-Ping Huang, Taichung, all of (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/918,638

(22) Filed: Aug. 1, 2001

(51) Int. Cl.[7] .................. H01L 21/3205; H01L 21/4763
(52) U.S. Cl. ........................................ 438/588; 438/229
(58) Field of Search .................. 438/197, 229, 438/230, 231, 232, 299, 301, 302, 304, 305, 581, 582, 583, 588, 551, 649, 650, 651, 655, 656, 663, 664, 680, 682, 683, 721, 723, 724, 743, 744, 745, 755

(56) References Cited

U.S. PATENT DOCUMENTS 5,963,803 A * 10/1999 Dawson et al. ............. 438/231
6,001,721 A * 12/1999 Huang ........................ 438/587
6,207,543 B1 * 3/2001 Harvey et al. .............. 438/586

* cited by examiner

*Primary Examiner*—David Nelms
*Assistant Examiner*—David Nhu

(57) ABSTRACT

This invention relates to a method for forming the salicide, more particularly, to the method for forming the salicide in the partial region. The present invention uses an oxide layer to be the mask layer to form the salicide in the partial region of the logic circuit. The silicide is formed on the gate and is not formed in the diffusion region, which are in the cell array region. The silicide is formed on the gate and in the diffusion region, which are in the periphery region. The present invention method can make the semiconductor device obtain lower resistance and decrease the leakage defects.

15 Claims, 15 Drawing Sheets

METHOD FOR FORMING THE PARTIAL SALICIDE

BACKGROUND OF THE INVENTION

1. Field of the Invention

This invention relates to a method for forming the salicide, more particularly, to the method for forming the salicide in the partial region to form the silicide on the gates which are in the periphery region and cell array region, and in the diffusion region which is in the periphery region. The present invention method can make the semiconductor device obtain lower resistance and decrease the leakage defects.

2. Description of the Prior Art

An increment in device integrity makes the resistance of metal oxide semiconductor (MOS) device source/drain regions gradually climb up and almost equal to the resistance of MOS device channel. In order to reduce the sheet resistance of source/drain regions and to guarantee a complete shallow junction between metal and MOS device, the application of a "Self aligned Silicide" process is gradually steeping into the very large scale integration (VLSI) fabrication of 0.5 micron ($\mu$m) and below. This particular process is called "Salicide" for short.

In general, the titanium silicon is usually used in silicide. The titanium silicide is formed to use two sequence steps rapid thermal process. At first, referring to FIG. 1, a silicon substrate 10 is provided and a MOS device and a shallow trench isolation are formed thereon. The MOS device comprises a source/drain region 12 a gate region, and as well as a spacer 18 formed on the sidewalls of the gate region. This gate region comprises a gate oxide layer 14 and a polysilicon layer 16, then using the chemical vapor deposition technique or the magnetron direct current sputtering technique to deposit a titanium metal layer 20 over the MOS and the shallow trench isolation. The thickness of the titanium metal layer 20 is about more than 300 angstroms. Next, a rapid thermal process is performed, wherein part of the titanium metal layer will react with the silicon on the source/drain region and with the polysilicon of the gate region to form a titanium silicide layer. The thickness of this titanium silicide layer is about 600 to 700 angstroms. The structure of this titanium silicide layer is a metastable C-49 phase structure with higher resistivity. Referring to FIG. 2, the unreacted titanium metal and the remained titanium metal are removed by applying the RCA cleaning method. Therefore, the titanium silicide layer 22 is existed on top of the gate region and the source/drain region. Finally, a rapid thermal process is performed again to transform higher resistivity of the C-49 phase titanium silicide structure into lower resistivity of the C-54 phase titanium silicide structure.

In the deep sub-micron device fabrication, the decline of the device driving current that cause by parasitic seties resistance of source/drain can be avoided by siliciding the source/drain. The above can be accomplished by either using simple silicidation of source/drain or self-aligned silicidation, where self-aligned silicidation can accomplish the silicidations of source/drain and gate region at the same time.

In the present logic circuit, the silicide is also needed to be used to decrease the resistance of the conductive layer and to increase the qualities of the semiconductor device. In order to cooperate the operation of the logic circuit, the partial region of the logic circuit will not be formed with the silicide to prevent the leakage defects producing on the semiconductor device. In the traditional salicide process, the silicide is formed on the partial material, which need to form silicide, by using complex steps. In the present semiconductor process, the process efficiency is important. Therefore, the traditional complex steps, which need more time, are not suitable for the present semiconductor process.

SUMMARY OF THE INVENTION

In accordance with the above-mentioned invention backgrounds, the traditional method can not form the silicide in the partial region of the logic circuit quickly. The main object of the present invention is to decrease the resistance of the word line, which is in the cell array region and periphery region, by using an oxide layer to be the mask layer to form the silicide on the gates, which are in the cell array region and the periphery region, and in the diffusion region, which is in the periphery region successfully.

The second objective of this invention is to avoid the leakage defects occurring in the diffusion region, which is in the cell array region, by using an oxide layer to be the mask layer to form the silicide on the gates, which are in the cell array region and the periphery region, and in the diffusion region, which is in the periphery region successfully.

The third objective of this invention is to decrease the resistance of the periphery region by using an oxide layer to be the mask layer to form the silicide on the gates, which are in the cell array region and the periphery region, and in the diffusion region, which is in the periphery region successfully.

The fourth objective of this invention is to increase the quality of the semiconductor device by using an oxide layer to be the mask layer to form the silicide on the gates, which are in the cell array region and the periphery region, and in the diffusion region, which is in the periphery region successfully.

It is a further objective of this invention to increase the proceeding efficiency of the semiconductor device process by using an oxide layer to be the mask layer to form the silicide on the gates, which are in the cell array region and the periphery region, and in the diffusion region, which is in the periphery region successfully.

In according to the foregoing objectives, the present invention provides a method to decrease the resistance of the word line, which is in the cell array region and periphery region and to avoid the leakage defects occurring in the diffusion region, which is in the cell array region, by using an oxide layer to be the mask layer to form the silicide on the gates, which are in the cell array region and the periphery region, and in the diffusion region, which is in the periphery region successfully. The present invention method can also decrease the resistance of the periphery region. The present invention method can further increase the quality of the semiconductor device and increase the proceeding efficiency of the semiconductor device process.

BRIEF DESCRIPTION OF THE DRAWINGS

In the accompanying drawing forming a material part of this description, there is shown.

DESCRIPTION OF THE PREFERRED EMBODIMENT

The foregoing aspects and many of the attendant advantages of this invention will become more readily appreciated as the same becomes better understood by reference to the following detailed description, when taken in conjunction with the accompanying drawings, wherein:

The semiconductor devices, which are in the logic circuit, are interconnected by using the word line and the bit line. The objective of the word line is to define the location of the signals and the objective of the bit line is to judge the types of the signal. Therefore, the word line connects with the gate of the semiconductor device and the bit line connects with the source/drain region of the semiconductor device. Regarding to the word line, it needs higher transmission rate to transmit the data. Therefore, a silicide is formed on the word line and on the gates of the semiconductor device to decrease the resistance of the word line and to increase the transmission rate of the word line by using the present invention method.

The logic circuit is divided into two major region, one is cell array region, the other is periphery region. The function of the cell array region is to save the data in an electric charge mode to the memory device which is in the cell array region. The function of the periphery region is to transmit and to compute the data by using the devices, which are in the periphery region, such as the adder, to treat the data. The data will be transmitted to other regions by using the periphery region after the data is treated. Therefore, the devices which are in the cell array region must be independent with each other to prevent the short circuit defects, which will lost the data. The devices which are in the periphery region must be interconnected with each other to increase the treating rate of the data. This shows that the present invention method must be used to form the silicide on the gate and the diffusion region of the periphery region, to form the silicide on the gate of the cell array region, and to avoid forming the silicide on the diffusion region of the cell array region. This condition will increase the data transmitting ability of the periphery region and prevent the short circuit defects, which will lost the data, occurring in the cell array region.

Figure 1:
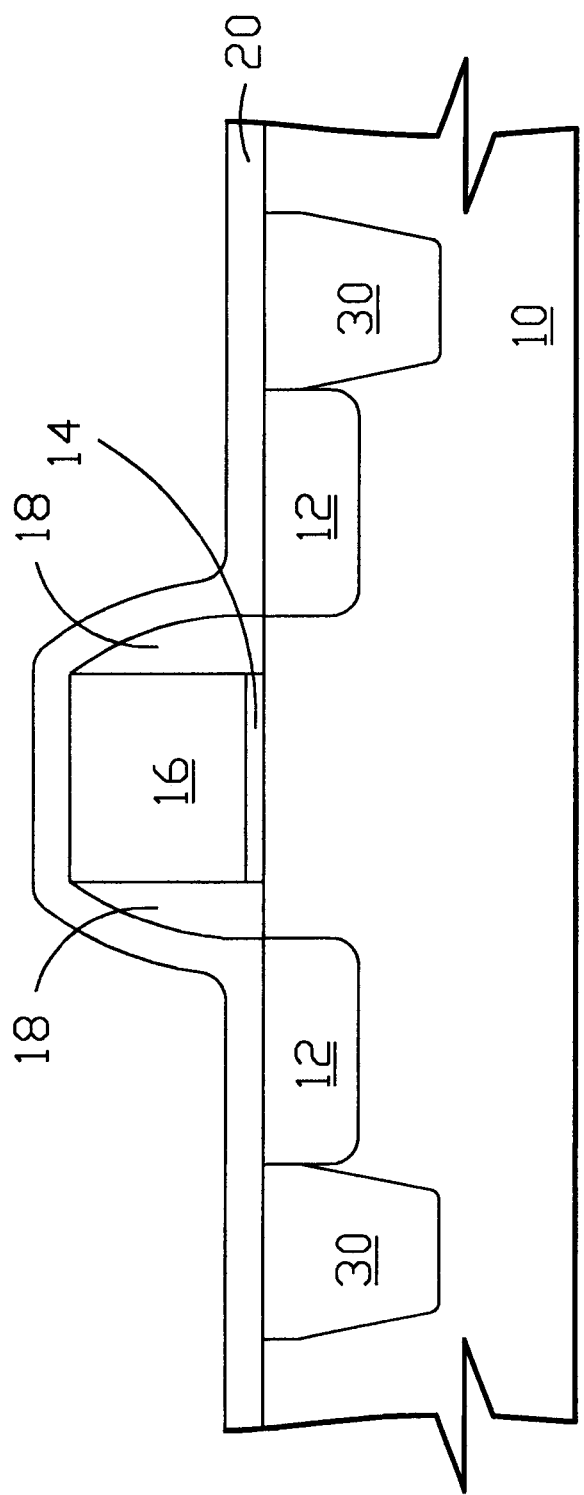
FIG. 1 shows a diagram in forming a titanium layer over the MOS by using the traditional technology.
Figure 2:
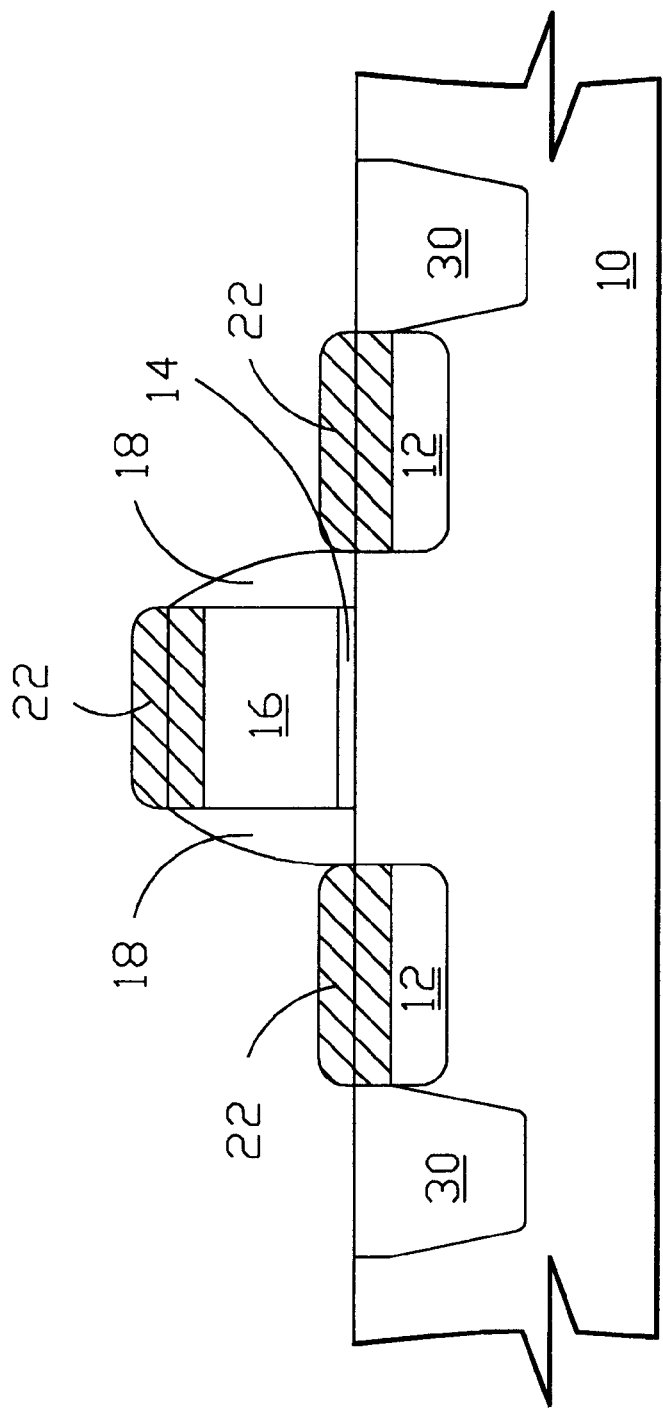
FIG. 2 shows a diagram in forming a titanium silicide layers on the gate region and source/drain region by using the traditional technology.
Figure 3:
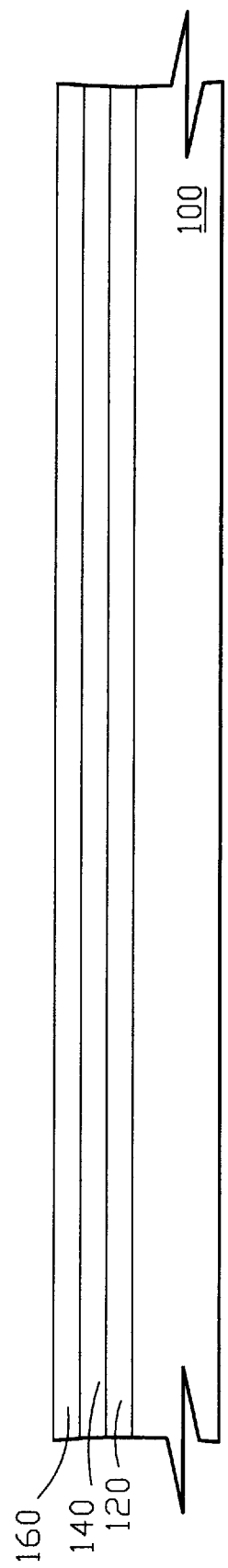
FIG. 3 shows a diagram in forming the first oxide layer, nitride layer, and the second oxide layer on the substrate.

Referring to FIG. 3, a wafer, which comprises a substrate 100, is provided at first and the first oxide layer 120 is formed on the substrate 100. Then the first nitride layer 140 is formed on the first oxide layer 120 and the second oxide layer 160 is formed on the first nitride layer 140 at last. The thickness of the first oxide layer 120 is usually about 70 to 90 angstroms, the thickness of the first nitride layer 140 is usually about 60 to 80 angstroms, and the thickness of the second oxide layer 160 is usually about 60 to 80 angstroms. In the present process, the thickness of the of the first oxide layer 120 is 80 angstroms, the thickness of the first nitride layer 140 is 70 angstroms, and the thickness of the second oxide layer 160 is 70 angstroms. Following the width of the process is shorter and shorter, the thickness of the first oxide layer 120, the first nitride layer 140, and the second oxide layer 160 will be decreased to conform to the needs of the process.

Figure 4:
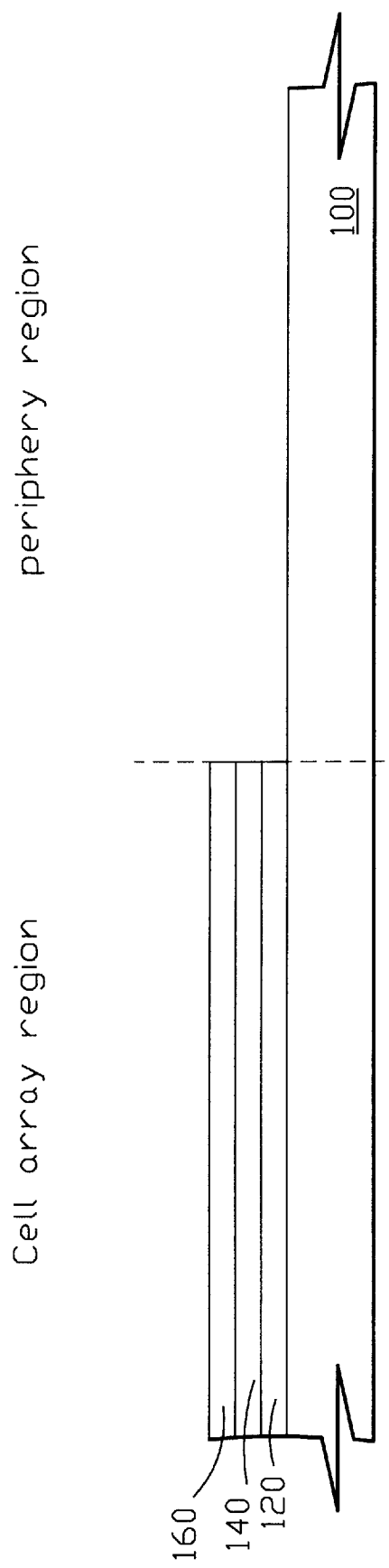
FIG. 4 shows a diagram in removing the first oxide layer, nitride layer, and the second oxide layer which are in the periphery region.
Figure 5:
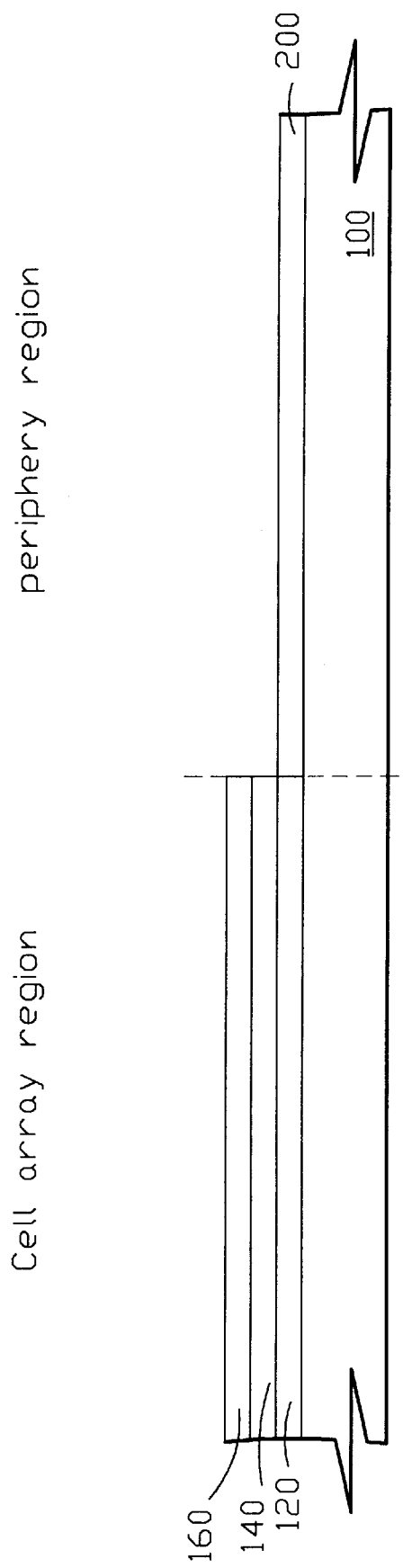
FIG. 5 shows a diagram in forming the third oxide layer on the substrate which is in the periphery region.

Referring to FIG. 4, after deciding the cell array region and the periphery region on the wafer, the first oxide layer 120, the first nitride layer 140, and the second oxide layer 160 which are in the periphery region are removed by a photolithography and a etching process to show the substrate in the periphery region. Referring to FIG. 5, the third oxide layer 200 is formed on the substrate 100 which is in the periphery region. The thickness of the third oxide layer 200 is usually about 40 to 60 angstroms. In the present process, the thickness of the third oxide layer 200 is 50 angstroms. But following the width of the process is shorter and shorter, the thickness of the third oxide layer 200 will be decreased to conform to the needs of the process. The silicon dioxide ($SiO_2$) is usually used to be the material of the first oxide layer 120, the second oxide layer 160, and the third oxide layer 200. The silicon nitride is usually used to be the material of the first nitride layer 140.

In the embodiment, the different forms dielectric layers are formed on the substrate, which is in the cell array region and the periphery region. The oxide/nitride/oxide sandwich form dielectric layer is formed on the substrate in the cell array region. The oxide layer is formed on the substrate in the periphery region to be the dielectric layer. Following the different needs of the process, the cell array region and the periphery region can use the same form dielectric layer which is formed on the substrate to keep the efficiency of the semiconductor devices. The same form dielectric layer can be the oxide layer.

Figure 6:
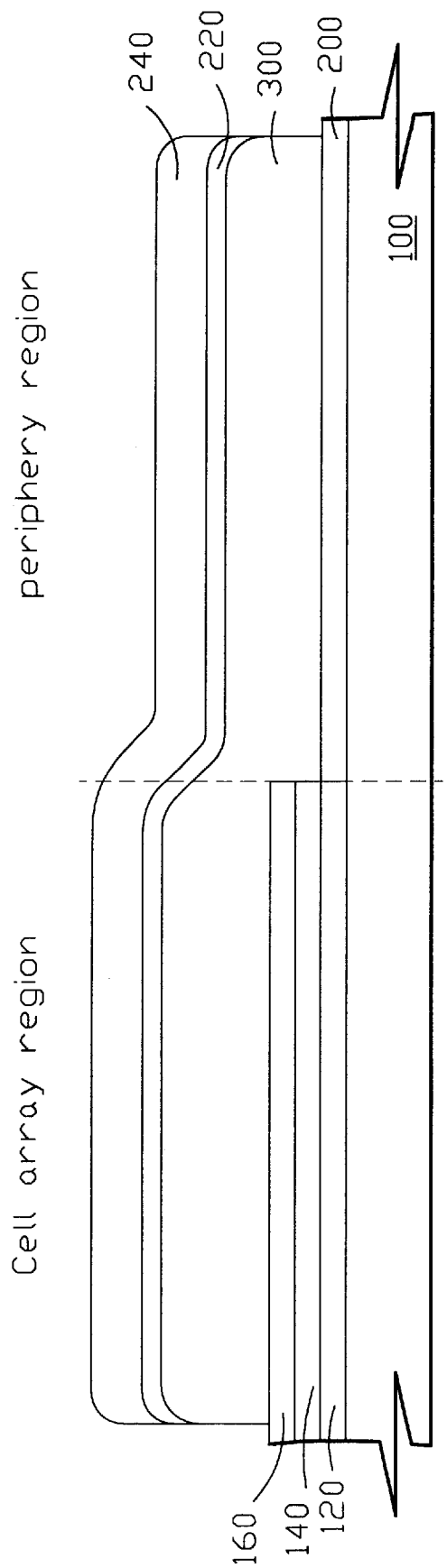
FIG. 6 shows a diagram in forming a silicon layer, the fourth oxide layer and the second nitride layer on the second oxide layer and the third oxide layer.
Figure 7:
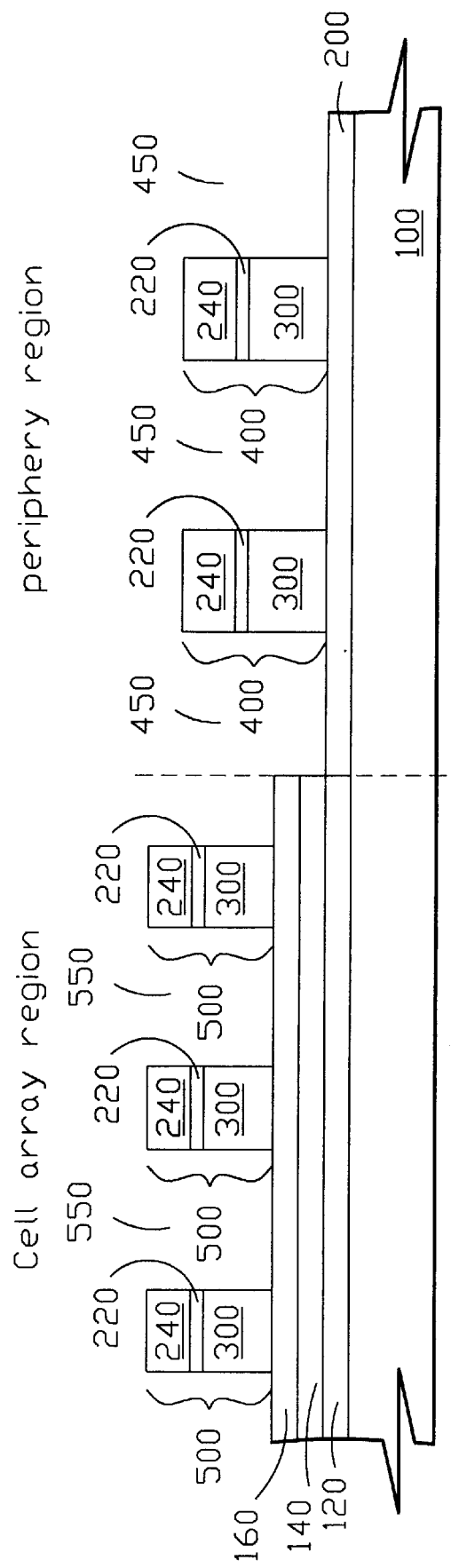
FIG. 7 shows a diagram in forming the plural first gates and the plural first diffusion regions in the periphery region and forming the plural second gates and the plural second diffusion regions in the cell array region.

Referring to FIG. 6, a silicon layer 300 is formed on the second oxide layer 160 and the third oxide layer 200. Then the fourth oxide layer 220 is formed on the silicon layer 300 by using the reoxide process. The silicon layer 300 is a gate layer and the fourth oxide layer 220 is the buffered layer. Then the second nitride layer 240 is formed on the fourth oxide layer 220. The objective of the buffered layer is to increase the combined ability with the silicon layer 300 and the second nitride layer 240. But following the different needs of the process, the buffered layer will be formed or not. Referring to FIG. 7, after deciding the location of the gates which are in the periphery region and cell array region, the partial silicon layer is removed by using a photolithography and a etching process to form the plural first gates 400 and the plural first diffusion regions 450 in the periphery region and to form the plural second gates 500 and the plural second diffusion regions 550 in the cell array region. The plural first diffusion regions 450 are located on the both sides of the plural first gates 400 and the plural second diffusion regions 550 are located on the both sides of the plural second gates 500.

Figure 8:
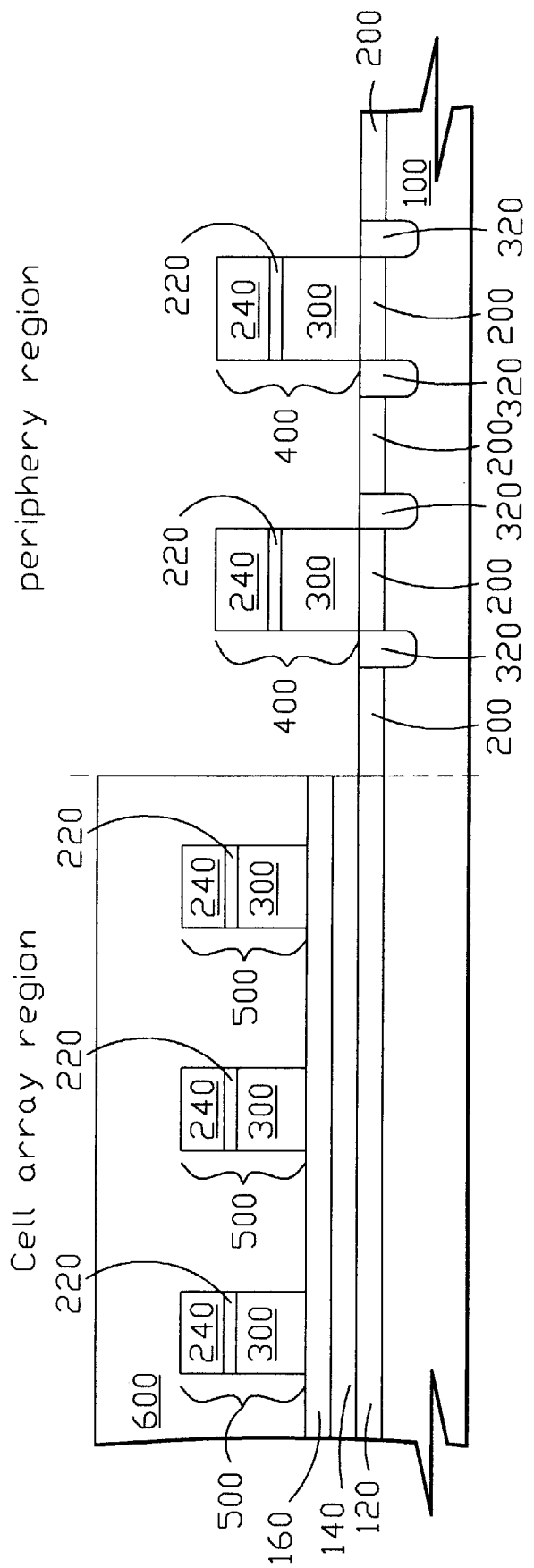
FIG. 8 shows a diagram in forming the first mask layer on the second nitride layer and the second oxide layer which are in the cell array region and forming the lightly doped drain in the plural first diffusion regions.
Figure 9:
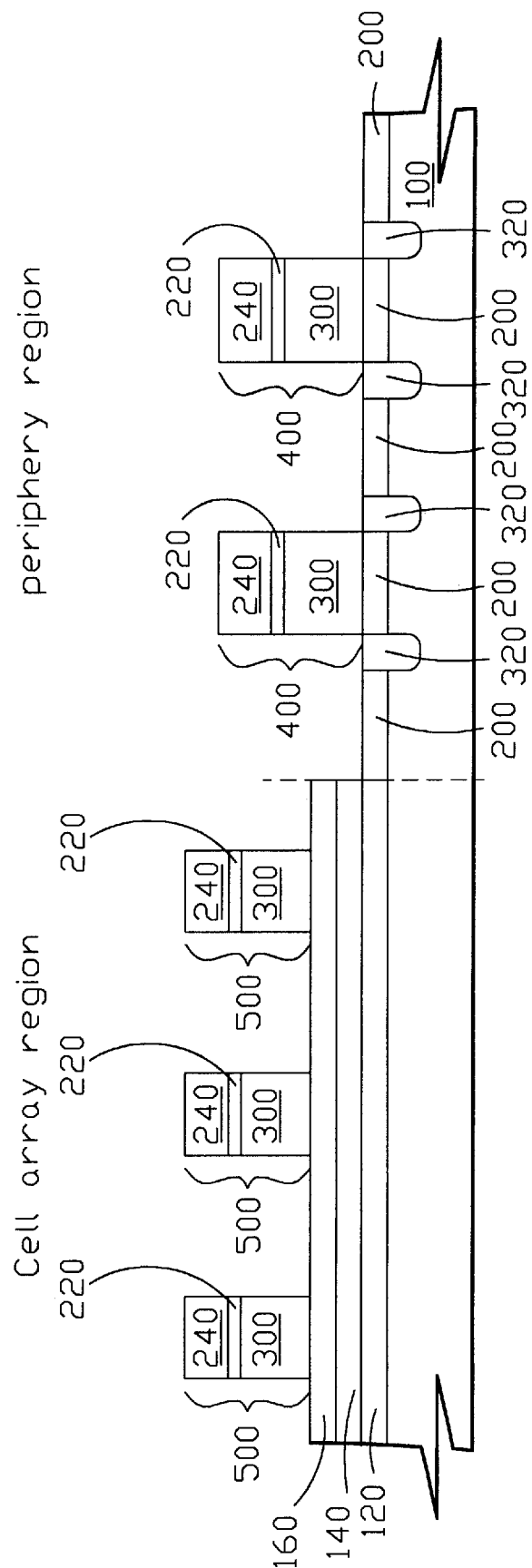
FIG. 9 shows a diagram in removing the first mask layer.

Referring to FIG. 8, the first mask layer 600 is formed on the second oxide layer 160 and the second nitride layer 240 which are in the cell array region. Then the lightly doped drain region 320 is formed in the plural first diffusion regions 450 by using the lightly doped drain process to decrease the hot carrier effects. Referring to FIG. 9, the first mask layer is removed to show the second oxide layer 160 and the second nitride layer 240 which are in the cell array region.

Figure 10:
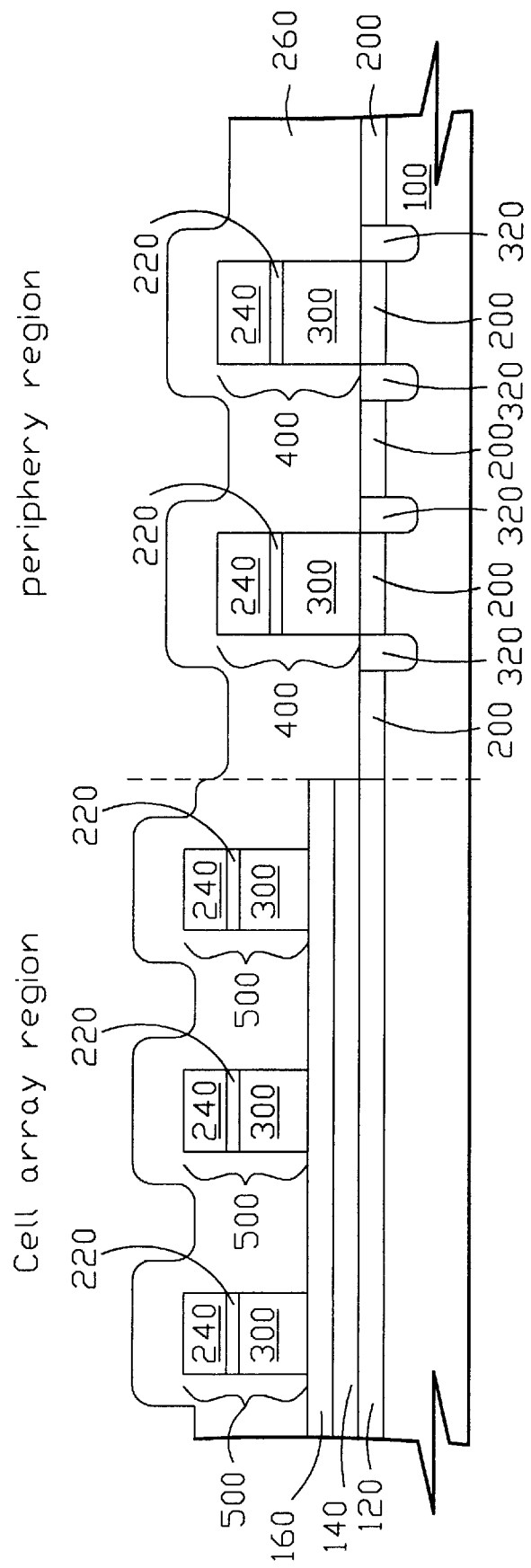
FIG. 10 shows a diagram in forming the fifth oxide layer on the second oxide layer, the third oxide layer, and the second nitride layer.

Referring to FIG. 10, the fifth oxide layer 260 is formed on the second oxide layer 160, the third oxide layer 200, and the second nitride layer 240. In the depositing the fifth oxide layer 260 process, the deposition rate in depositing the fifth oxide layer 260 on the second oxide layer 160 and the third oxide layer 200 is faster than the deposition rate in depositing the fifth oxide layer 260 on the second nitride layer 240 by using the different selectivity in the fifth oxide layer to different basic boards.

Figure 11:
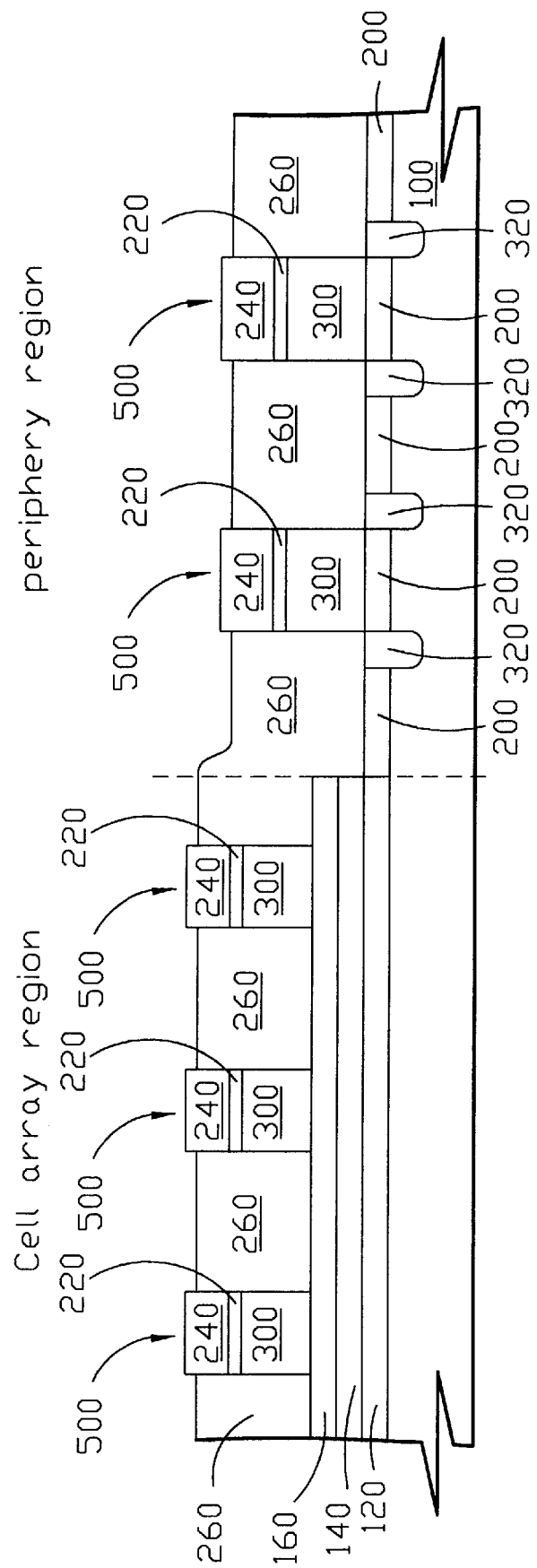
FIG. 11 shows a diagram in removing the partial fifth oxide layer to show the second nitride layer on the top of the plural first gates and the plural second gates.
Figure 12:
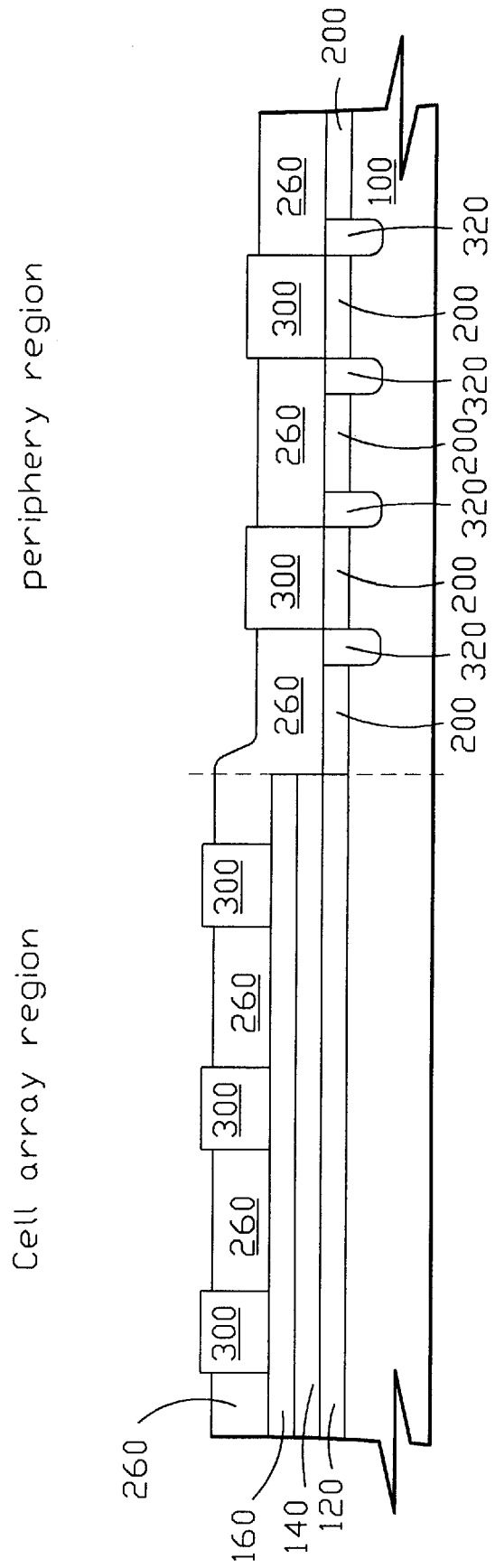
FIG. 12 shows a diagram in removing the second nitride layer and the fourth oxide layer to show the silicon layer on the top of the plural first gates and the plural second gates.

Referring to FIG. 11, the partial fifth oxide layer 260 is removed by using an etching-back process to show the second nitride layer 240 on the top of the plural first gates 400 and the plural second gates 500 and the thickness of the fifth oxide layer 260 is decreased thinner than the thickness of the silicon layer 300. Referring to FIG. 12, the second nitride layer 240 and the fourth oxide layer 220 are removed to show the silicon layer 300 on the top of the plural first gates 400 and the plural second gates 500.

Figure 13:
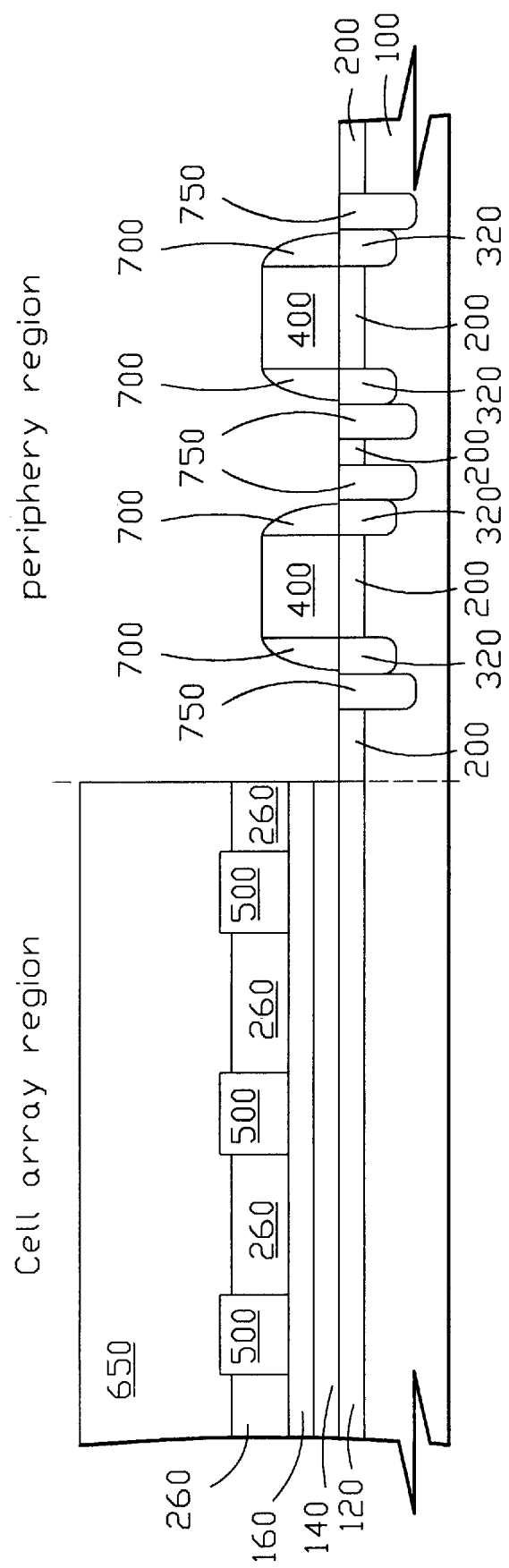
FIG. 13 shows a diagram in forming the second mask layer on the fifth oxide layer and the silicon layer which are in the cell array region, removing the partial fifth oxide layer which is in the periphery region to form the spacers on the sidewalls of the plural first gates, and showing the third oxide layer on the top of the plural first diffusion regions.

Referring to FIG. 13, the second mask layer 650 is formed on the fifth oxide layer 260 and the silicon layer 300 which are in the cell array region, the partial fifth oxide layer 260 which is in the periphery region is removed to form the spacers 700 on the sidewalls of the plural first gates, and the third oxide layer 200 is showed on the top of the plural first diffusion regions. Then the ions which are needed in the process are implanted into the plural first diffusion regions to form the source/ drain regions 750.

Figure 14:
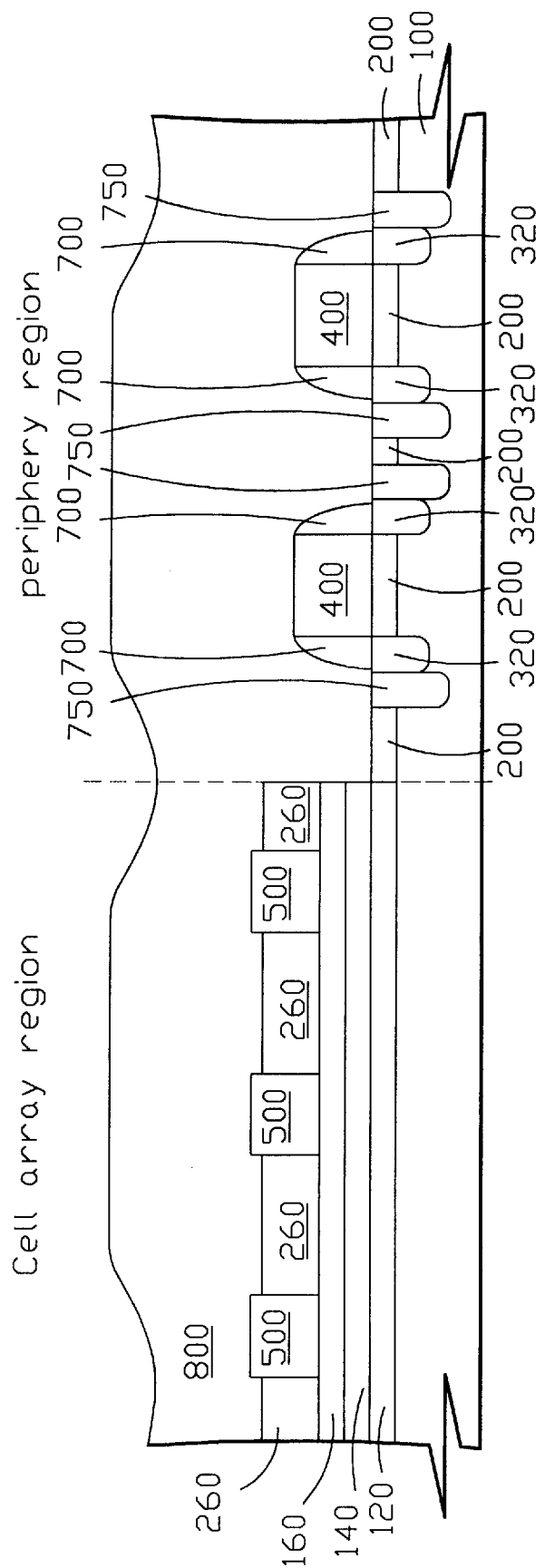
FIG. 14 shows a diagram in forming a metal layer on the plural first gates, the plural first diffusion regions, the plural second gates, and the fifth oxide layer which is in the cell array region.
Figure 15:
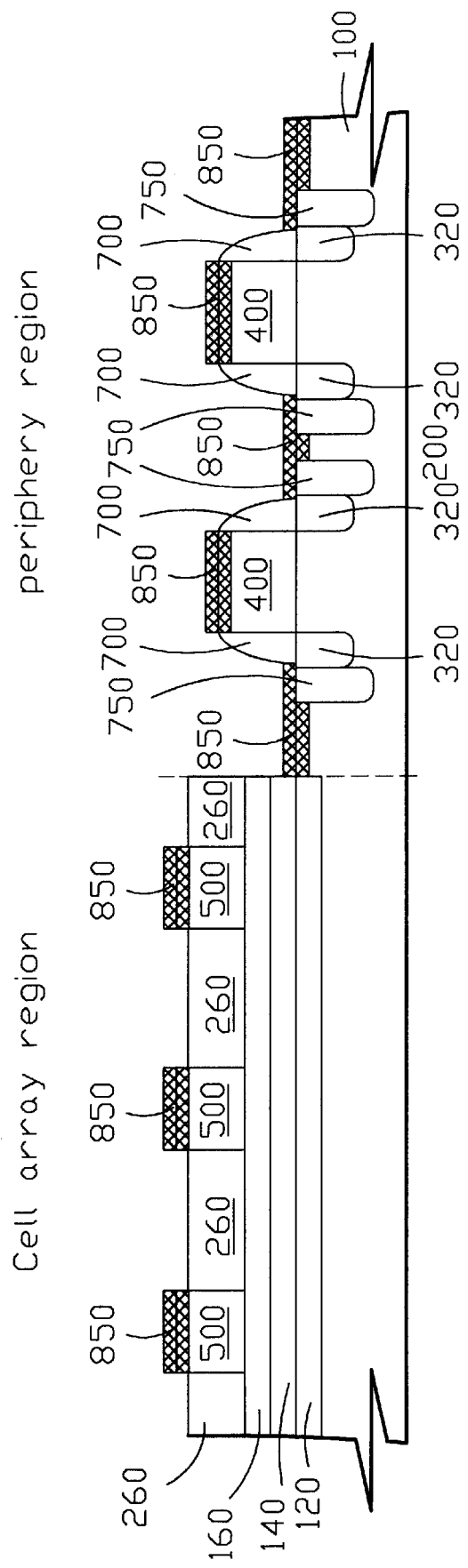
FIG. 15 shows a diagram in forming a silicide layer on the plural first gates, the plural first diffusion regions, and the plural second gates.

Referring to FIG. 14, after removing the second mask layer 650, the metal layer 800 is formed on the fifth oxide layer 260 which is in the cell array region, the plural first gates 400, the plural first diffusion regions 450, and the plural second gates 500. Before the metal layer 800 is formed, the wet etching method is used to clean oxide, which is on the surface of the silicon layer and the plural first diffusion regions, to make the metal layer be formed easier. The chemical vapor deposition method or the direct current magnetron sputtering method is most used to form the metal layer 800. Then the wafer is placed into the chamber to proceed the first rapid thermal process (RTP). The metal layer 800 will react with the silicon, which is at the contact region, to form the silicide layer. The using temperature of the silicide process is about 500 to 700° C. The structure of the metal silicide which is formed in the first rapid thermal process is a metastable C-49 phase structure with higher resistivity. Referring to FIG. 15, the unreacted and the remained metal layer 800 is removed by applying the RCA cleaning method. Therefore, the silicide layers 850 are existed on the top of the plural first gates 400, the plural first diffusion regions 450, and the plural second gates 500. Finally, the second rapid thermal process is performed to transform higher resistivity of the C-49 phase silicide structure into lower resistivity of the C-54 phase silicide structure. The using temperature of the second rapid thermal process is about 750 to 850° C. The material of the metal layer 800 can be titanium, cobalt, and platinum. Titanium is usually used to be the material of the metal layer 800.

Titanium is the most common used metallic material for the current salicide process. Basically, titanium is a fine oxygen gettering material, where under an appropriate temperature titanium and silicon at MOS device source/drain and gate regions are easily mutually diffused to form a titanium silicide with very low resistance.

Because the fifth oxide layer 260 is not formed on the second oxide layer 240 easily, therefore, it is easily to remove the fifth oxide layer 260 from the plural first gates and the plural second gates. This condition will increase the efficiency of the process. The thickness of the fifth oxide layer 260 which is in the plural second diffusion region is enough to resist the metal ions passing through this fifth oxide layer 260 and reacting with the substrate 100 which is under the fifth oxide layer 260 to form the silicide in the back-end salicide process. This fifth oxide layer 260 will prevent the silicide forming in the plural second diffusion region 550 to cause the leakage defects.

Following the different needs of the process, the fourth oxide layer 220 and the second nitride layer 240 can not have to be formed to simplify the steps of the process. When the forth oxide layer 220 and the second nitride layer are not formed in the process, the deposition rate in depositing the fifth oxide layer 260 on the second oxide layer 160 and the third oxide layer 200 is faster than the deposition rate in depositing the fifth oxide layer 260 on the silicon layer 300 by using the different selectivity in the fifth oxide layer to different basic boards in the depositing the fifth oxide layer 260 process.

In accordance with the present invention, the present invention provides a method to decrease the resistance of the word line, which is in the cell array region and periphery region and to avoid the leakage defects occurring in the diffusion region, which is in the cell array region, by using an oxide layer to be the mask layer to form the silicide on the gates, which are in the cell array region and the periphery region, and in the diffusion region, which is in the periphery region successfully. The present invention method can also decrease the resistance of the periphery region. The present invention method can further increase the quality of the semiconductor device and increase the proceeding efficiency of the semiconductor device process.

Although specific embodiments have been illustrated and described, it will be obvious to those skilled in the art that various modifications may be made without departing from what is intended to be limited solely by the appended claims.

What is claimed is:

1. A method for forming a partial salicide, said method comprises:

provising a wafer, wherein said wafer comprises a substrate and said substrate comprises a first region and a second region;

forming a first oxide layer on said substrate;

forming a silicon layer on said first oxide layer;

forming a nitride layer on said silicon layer;

removing said partial silicon layer and said partial nitride layer to form a plural first gates and a plural first diffusion regions in said first region and to form a plural second gates and a plural second diffusion regions in a second region of said wafer, wherein said plural first diffusion regions are located on a side of said plural first gates and said plural second diffusion regions are located on a side of said plural second gates;

forming a second oxide layer on said plural first diffusion regions, said plural first gates, said plural second diffusion regions, and said plural second gates;

removing said partial second oxide layer to show said nitride layer on a top of said plural first gates and a top of said plural second gates;

removing said nitride layer to show said silicon layer on said top of said plural first gates and said top of said plural second gates;

forming a mask layer on said plural second gates and said second oxide layer which are in said second region;

removing said partial second oxide layer to form a spacer on a sidewall of said plural first gates and to show said first oxide layer on said plural first diffusion regions;

forming a source/drain region in said plural first diffusion regions;

forming a metal layer on said plural first gates, said plural first diffusion regions, said second oxide layer, and said plural second gates;

proceeding a rapid thermal process to form a silicide layer on said plural first gates, said plural first diffusion regions, and said plural second gates; and removing said metal layer.

2. The method according to claim 1, wherein said a material of said metal layer is titanium.

3. The method according to claim 1, wherein said a material of said metal layer is cobalt.

4. The method according to claim 1, wherein said a material of said metal layer is platinum.

5. The method according to claim 1, wherein said first region is cell array region.

6. The method according to claim 1, wherein said second region is periphery region.

7. A method for forming a partial salicide, said method comprises:

providing a wafer, wherein said wafer comprises a substrate;

forming a first oxide layer on said substrate;

forming a nitride layer on said first oxide layer;

forming a second oxide layer on said nitride layer;

removing said partial first oxide layer, said partial nitride layer, and said partial second oxide layer to show said substrate in a first region of said wafer;

forming a third oxide layer on said substrate which is in said first region;

forming a silicon layer on said second oxide layer and said third oxide layer;

forming a fourth oxide layer on said silicon layer;

forming a second nitride layer on said fourth oxide layer;

removing said partial silicon layer, said partial fourth oxide layer, and said partial second nitride layer to form a plural first gates and a plural first diffusion regions in said first region and to form a plural second gates and a plural second diffusion regions in a second region of said wafer, wherein said plural first diffusion regions are located on a side of said plural first gates and said plural second diffusion regions are located on a side of said plural second gates;

forming a lightly doped drain in said plural first diffusion regions;

forming a fifth oxide layer on said plural first diffusion regions, said plural first gates, said plural second diffusion regions, and said plural second gates;

removing said partial fifth oxide layer to show said second nitride layer on a top of said plural first gates and a top of said plural second gates;

removing said second nitride layer to show said silicon layer on said top of said plural first gates and said top of said plural second gates;

forming a mask layer on said plural second gates and said fifth oxide layer which are in said second region;

removing said partial fifth oxide layer to form a spacer on a sidewall of said plural first gates and to show said third oxide layer on said plural first diffusion regions;

forming a source/drain region in said plural first diffusion regions;

forming a metal layer on said plural first gates, said plural first diffusion regions, said fifth oxide layer, and said plural second gates;

proceeding a first rapid thermal process to form a silicide layer on said plural first gates, said plural first diffusion regions, and said plural second gates; and removing said metal layer and proceeding a second rapid thermal process.

8. The method according to claim 7, wherein said a material of said metal layer is titanium.

9. The method according to claim 7, wherein said a material of said metal layer is cobalt.

10. The method according to claim 7, wherein said a material of said metal layer is platinum.

11. The method according to claim 7, wherein said first region is cell array region.

12. The method according to claim 7, wherein said second region is periphery region.

13. A method for forming a partial salicide, said method comprises:

providing a wafer, wherein said wafer comprises a substrate;

forming a first oxide layer on said substrate;

forming a nitride layer on said first oxide layer;

forming a second oxide layer on said nitride layer;

removing said partial first oxide layer, said partial nitride layer, and said partial second oxide layer to show said substrate in a first region of said wafer;

forming a third oxide layer on said substrate which is in said first region;

forming a silicon layer on said second oxide layer and said third oxide layer;

forming a second nitride layer on said silicon layer;

removing said partial silicon layer and said partial second nitride layer to form a plural first gates and a plural first diffusion regions in said first region and to form a plural second gates and a plural second diffusion regions in a second region of said wafer, wherein said plural first diffusion regions are located on a side of said plural first gates and said plural second diffusion regions are located on a side of said plural second gates;

forming a fourth oxide layer on said plural first diffusion regions, said plural first gates, said plural second diffusion regions, and said plural second gates;

removing said partial fourth oxide layer to show said second nitride layer on a top of said plural first gates and a top of said plural second gates;

removing said second nitride layer to show said silicon layer on said top of said plural first gates and said top of said plural second gates;

forming a mask layer on said plural second gates and said fourth oxide layer which are in said second region;

removing said partial fourth oxide layer to form a spacer on a sidewall of said plural first gates and to show said third oxide layer on said plural first diffusion regions;

forming a source/drain region in said plural first diffusion regions;

forming a metal layer on said plural first gates, said plural first diffusion regions, siad fourth oxide layer, and said plural second gates;

proceeding a rapid thermal process to form a silicide layer on said plural first gates, said plural first diffusion regions, and said plural second gates; and removing said metal layer.

14. The method according to claim 13, wherein said first region is cell array region.

15. The method according to claim 13, wherein said second region is periphery region.

* * * * *